US007293852B2

(12) United States Patent
Newsome et al.

(10) Patent No.: US 7,293,852 B2
(45) Date of Patent: Nov. 13, 2007

(54) DEPOSITION OF SOLUBLE MATERIALS USING AN INKJET PRINT HEAD AND CCD MICROSCOPE

(75) Inventors: Christopher Newsome, Cambridge (GB); Takeo Kawase, Suwa (JP)

(73) Assignee: Seiko Epson Corporation, Tokyo (JP)

(*) Notice: Subject to any disclaimer, the term of this patent is extended or adjusted under 35 U.S.C. 154(b) by 219 days.

(21) Appl. No.: 10/475,225

(22) PCT Filed: Sep. 9, 2002

(86) PCT No.: PCT/GB02/04070

§ 371 (c)(1),
(2), (4) Date: Oct. 20, 2003

(87) PCT Pub. No.: WO03/022591

PCT Pub. Date: Mar. 20, 2003

(65) Prior Publication Data

US 2004/0109038 A1 Jun. 10, 2004

(30) Foreign Application Priority Data

Sep. 10, 2001 (GB) ................................ 0121821.3

(51) Int. Cl.

| | |
|---|---|
| ***B41J 29/393*** | (2006.01) |
| ***B41J 2/165*** | (2006.01) |
| ***C23C 16/52*** | (2006.01) |
| ***B05D 5/06*** | (2006.01) |

(52) U.S. Cl. .............................. 347/19; 347/23; 427/8; 427/66

(58) Field of Classification Search .................. 347/19, 347/20, 73, 78, 81, 74, 75, 54, 23; 427/8, 427/66

See application file for complete search history.

(56) References Cited

U.S. PATENT DOCUMENTS 4,493,993 A * 1/1985 Kanamuller et al. ..... 250/222.1
5,631,678 A * 5/1997 Hadimioglu et al. .......... 347/46
5,691,533 A * 11/1997 Freeman et al. ......... 250/222.1

(Continued)

FOREIGN PATENT DOCUMENTS

| | | |
|---|---|---|
| DE | 38 19 036 A1 | 12/1988 |
| DE | 3819036 | 12/1988 |
| EP | 0 738 905 A2 | 10/1996 |
| EP | 1 043 162 A1 | 10/2000 |
| GB | 2 323 565 A | 9/1998 |
| GB | 2 349 213 A | 10/2000 |

(Continued)

OTHER PUBLICATIONS

IBM Technical Disclosure Bulletine, Mar. 1975, US—ACC-No. NN75032851; Title—Ink Jet Stream Sensor; vol. 17, Issue 10, p. 2851-2852, Publication Date—Mar. 1, 1975.*

*Primary Examiner*—Stephen Meier
*Assistant Examiner*—Rene Garcia, Jr.
(74) *Attorney, Agent, or Firm*—Oliff & Berridge, PLC

(57) ABSTRACT

A method and apparatus for depositing a soluble material, such as an organic polymer, onto a substrate uses an inkjet print head. The substrate is viewed from the underside by a CCD microscope during the deposition of an organic polymer droplet onto a well provided in a bank structure. As the organic polymer droplets are viewed when in wet condition they are more clearly visible and any offset or deviation detected between the deposited droplet and the well can be used to reposition a platen supporting the substrate. The substrate is viewed with light having a wavelength to which the substrate is transparent and, preferably, which does not include a wavelength component within the absorption region of the polymer.

31 Claims, 9 Drawing Sheets

U.S. PATENT DOCUMENTS

| | | | | |
|---|---|---|---|---|
| 5,911,918 | A * | 6/1999 | Shacklette et al. | 252/500 |
| 6,060,113 | A * | 5/2000 | Banno et al. | 427/78 |
| 6,106,095 | A * | 8/2000 | Jackson et al. | 347/19 |
| 6,322,192 | B1 | 11/2001 | Walker | |
| 6,347,857 | B1 * | 2/2002 | Purcell et al. | 347/19 |
| 6,511,358 | B2 * | 1/2003 | Banno et al. | 445/24 |
| 6,517,995 | B1 * | 2/2003 | Jacobson et al. | 430/320 |
| 6,566,276 | B2 * | 5/2003 | Maloney et al. | 438/758 |
| 6,620,625 | B2 * | 9/2003 | Wolk et al. | 436/180 |
| 6,863,961 | B2 * | 3/2005 | Miyashita et al. | 428/203 |
| 2001/0046081 | A1 * | 11/2001 | Hayashi et al. | 359/296 |
| 2002/0076495 | A1 * | 6/2002 | Maloney et al. | 427/272 |
| 2002/0105080 | A1 * | 8/2002 | Speakman | 257/749 |
| 2003/0010287 | A1 * | 1/2003 | Banno et al. | 118/688 |
| 2003/0020777 | A1 * | 1/2003 | Su et al. | 347/19 |
| 2003/0052937 | A1 * | 3/2003 | Su et al. | 347/19 |
| 2003/0076649 | A1 * | 4/2003 | Speakman | 361/524 |
| 2003/0081040 | A1 * | 5/2003 | Therien et al. | 347/19 |
| 2004/0014239 | A1 * | 1/2004 | Wolk et al. | 436/180 |
| 2004/0146637 | A1 * | 7/2004 | Banno et al. | 427/77 |

FOREIGN PATENT DOCUMENTS

| | | |
|---|---|---|
| GB | 2 351 558 A | 1/2001 |
| JP | A 2000-94652 | 4/2000 |
| JP | A 2000-233495 | 8/2000 |
| JP | A 2002-214421 | 7/2002 |
| WO | WO 91/00807 | 1/1991 |

* cited by examiner

DEPOSITION OF SOLUBLE MATERIALS USING AN INKJET PRINT HEAD AND CCD MICROSCOPE

BACKGROUND

The present invention relates to the deposition of soluble materials and in particular to the deposition of soluble materials using inkjet technology.

In recent years there has been an increase in the number of products which require, as part of their fabrication process, the deposition of organic or inorganic soluble or dispersible materials such as polymers, dyes, colloid materials and the like on solid surfaces. One example of these products is an organic polymer electroluminescent display device. An organic polymer electroluminescent display device requires the deposition of soluble polymers into predefined patterns on a solid substrate in order to provide the light emitting pixels of the display device. The substrate may, for example, be formed of glass, plastics or of silicon.

In the manufacture of semiconductor display devices, such as light emitting diode (LED) displays, it has been conventional to use photo-lithographic techniques. However, photo-lithographic techniques are relatively complex, time consuming and costly to implement. In addition, photo-lithographic techniques are not readily suitable for use in the fabrication of display devices incorporating soluble organic polymer materials. Concerns relating to the fabrication of the organic polymer pixels have, to some extent, hindered the development of products such as electroluminescent display devices incorporating such materials to act as the light emitting pixel elements. Consequently, it has been proposed to use ink-jet technology to deposit the soluble organic polymers in the fabrication of electroluminescent display devices.

Inkjet technology is, by definition, ideally suited to the deposition of the above soluble or dispersible materials. It is a fast and inexpensive technique to use. In contrast to alternative techniques such as spin coating or vapour deposition, it instantly provides patterning without the need for an etch step in combination with a lithographic technique. However, the deposition of the soluble organic materials onto the solid surface using ink-jet technology differs from the conventional use of the technology, to deposit ink on paper, and a number of difficulties are encountered. In particular, there is a primary requirement in a display device for uniformity of light output and uniformity of electrical characteristics. There are also spatial limitations imposed in device fabrication. As such, there is the non-trivial problem to provide very accurate deposition of the soluble polymers onto the substrate from the inkjet print head. This is particularly so for colour displays as respective polymers providing red, green and blue light emissions are required to be deposited at each pixel of the display.

To assist the deposition of the soluble materials it has been proposed to provide the substrate with a layer which includes a pattern of wall structures defined in a de-wetting material so as to provide an array of wells or elongate trenches, bounded by the wall structures, for receiving the material to be deposited. Such a pre-patterned substrate will be referred to hereinafter as a bank structure. When organic polymers in solution are deposited into the wells, the difference in the wettability of the organic polymer solutions and the bank structure material causes the solution to self align into the wells provided on the substrate surface. However, it is still necessary to deposit the droplets of organic polymer material in substantial alignment with the wells in the bank structure. Even when such a bank structure is used, the deposited organic polymer solution adheres to some extent to the walls of the material defining the wells. This causes the central area of each deposited droplet to have, at best, a thin coating of deposited material, perhaps as low as 10% of the material in comparison to the material deposited at the walls of the bank structure. The deposited polymer material at the centre of the wells acts as the active light emissive material in the display device and if the polymer material is not deposited in accurate alignment with the wells, the amount and therefore the thickness of the active light emissive material can be further reduced. This thinning of the active light emissive material is of serious concern because the current passing through the material in use of the display is increased which reduces the life expectancy and the efficiency of the light emissive devices of the display. This thinning of the deposited polymer material will also vary from pixel to pixel if deposition alignment is not accurately controlled. This gives rise to a variation in the light emission performance of the organic polymer material from pixel to pixel because the LED's constituted by the organic material are current driven devices and, as stated above, the current passing through the deposited polymer material will increase with any decrease in the thickness of the deposited material. This performance variation from pixel to pixel gives rise to non-uniformity in the displayed image, which degrades the quality of the displayed image. This degradation of image quality is in addition to the reduction in operating efficiency and working life expectancy of the LED's of the display. It can be seen therefore that accurate deposition of the polymer materials is essential to provide good image quality and a display device of acceptable efficiency and durability.

SUMMARY

There are two main types of inkjet head. One type uses a thermal print head and these are commonly known as bubble jet heads. The second type uses a piezoelectric print head where a piezoelectric device is located behind a diaphragm in communication with a reservoir. In this second type of inkjet head the piezoelectric device is energized and the diaphragm deflects to pressurize the reservoir, forcing the liquid contained in the reservoir, in this case the polymer material in solution to provide the light emissive pixels for a display, out through a nozzle as a fine droplet of the polymer material. With either type of print head, the nozzle has a very small outlet orifice, typically of a diameter of about 30 microns. The organic polymers are usually dissolved in a relatively volatile organic solvent so that they can be deposited in solution.

During deposition, the inkjet print head is maintained as close as possible to the substrate carrying the bank structure. Usually, the inkjet print head is arranged at a separation of about 0.5 mm to 1.0 mm above the substrate and this separation is also used to initially check optically the alignment of the print head with a well in the bank structure. The wells in the bank structure are very small in size so a high magnification microscope is required for this optical alignment check. As high magnification is used, there is very little depth of field in the viewed image and hence, it is usually not possible to have a well in the bank structure and the nozzle of the inkjet head in focus at the same time.

It is also necessary to ensure that the viewing axis is exactly perpendicular to the substrate, otherwise an offset is seen between a well and a nozzle of the ink jet head. This also is very difficult to achieve in practice. Optical alignment of an inkjet head with wells of the bank structure cannot therefore be achieved with the required accuracy so there is a need to view actual deposition of a drop of material to check alignment. However, in inkjet printing the droplets have a flight speed typically in the range of 2 to 10 m/sec. The relative speed between the substrate and print head is typically in the range of 10 to 100 mm/sec. Assuming a droplet speed of about 5 m/sec and a separation of 1 mm between the inkjet head and substrate, the time taken for an ejected droplet to reach the substrate is about 2 milliseconds. If the print head has a transverse speed of 100 mm/sec relative to the deposition substrate, an offset of 20 μm will be created between the ejection point and the actual deposition point on the substrate. This offset is regular and equal for all nozzles of the inkjet print head. For conventional printing, in which case the substrate is paper, which is the normal use of this technology, this offset is not problematical because it is the same over the entire printed image and such a small offset in the position of the printed image on the paper is not discernible to a person viewing the printed image.

However, because the organic polymers are dissolved in a solvent, some evaporation of the solvent can occur as the solution ejects from the nozzle outlet orifice, so it is common for deposits of the polymer material to form around the inkjet nozzle. These deposits tend to form in an uneven fashion and therefore give rise to an irregular profile for the periphery of the nozzle orifice, causing a deflection of the material as it ejects from the print head nozzle. Because of the deflection to the ejected material, the ejected droplets invariably do not have a perpendicular flight angle to the substrate. This gives rise to further but irregular offsets between the desired and actual positions of a deposited droplet on the substrate. Furthermore, the deposits around the nozzle orifice usually vary during the deposition process and likewise, therefore, the offset between the desired and actual deposition sites can also vary in an irregular manner over the period during which the droplets are deposited. There is, therefore, a significant need to repeatedly monitor the deposition of droplets to ensure that the required accuracy of deposition is being maintained during device fabrication. If deposition accuracy is not being maintained the nozzles of the inkjet head must be cleaned of the deposits. This irregular offset between the position of the inkjet head and the deposition site gives rise to a further concern regarding checking alignment of the inkjet head nozzles with the wells in the bank structure.

The inkjet head usually comprises an array of nozzles so that as the head is translated over the deposition area, a number of droplets of the organic polymer are deposited simultaneously. However, because the build up of deposits is totally random in nature, the irregular offset for a first nozzle of the head may be in one direction (compared to the flight path for the nozzle without any build up of deposit), for example causing the ejected droplet to travel more in the direction of travel of the inkjet head, whilst the deposit at a second nozzle of the head may, for example., cause an offset in a direction opposite to the first direction, i.e. in a direction opposite to the direction of travel of the head. As stated above, there is a regular offset caused by the flight time of a droplet and the speed of movement of the inkjet head. If, for example, the substrate is moving relative to the head, a droplet would actually be deposited to one side of the target well in the bank structure because the well would have moved past the flight path contact point by the time the droplet has transversed the separation gap between the head and the substrate. This is the regular offset referred to above and this can be compensated during initial optical alignment. However in this instance, the regular offset will be cancelled by the irregular offset caused by the deposit. Therefore, if this particular well in the bank structure is viewed after deposition of a droplet, it would give the impression that there are no alignment concerns because the deposited droplet may appear to be perfectly aligned in its target well in the bank structure, but this is due to the irregular offset which may vary during the deposition process. However, the irregular offset for the second nozzle is in the opposite direction to that of the first nozzle. Hence, in this second case, the regular and irregular offsets would be cumulative and could provide an unacceptable degree of misalignment between the droplets being ejected from the second nozzle and their target wells in the bank structure, but this unacceptable alignment would not be noticed because the alignment check on the first droplet indicates that the inkjet head is aligned with the bank structure. This is particularly so in the production of relatively large size electroluminescent display devices, because deposition occurs over a longer period of time and there is increased likelihood of variable offsets.

If the substrate is of a relatively large size further irregular offsets may be introduced due to thermal expansion or contraction of the substrate, such as those arising from changes in the ambient conditions in the deposition zone.

Additional variable offsets may also be caused by bending of the translation system for the inkjet head. As can be seen from FIG. 1, the inkjet print head is supported from a transverse beam which is usually disposed horizontally. The beam, being a physical structure, bends very slightly under gravitational forces. The centre part of the beam will substantially maintain its horizontal disposition so a droplet deposited with the print head positioned at this central location A will maintain a perpendicular flight path $A^1$, as shown in FIG. 2, to the substrate. However, as the print head is translated away from this central part of the beam, such as to position B shown in FIG. 2, it will no longer be supported by a truly horizontal beam so the flight path $B^1$ at this second position will no longer be perpendicular to the substrate. Hence, if the print head is moved by X cm along the beam, this can give rise to a variation in deposition point of $X+\alpha$ at the substrate, where $\alpha$ is the additional variable offset caused by the slight bending of the beam. This variable offset can be seen to be present even on relatively small substrates and as the substrate becomes larger, the offset becomes even more noticeable because the translation system becomes longer, giving rise to an increase in the deviation from a perpendicular flight path to the substrate.

All of the above offsets may give rise to a variation from the optimum thickness for the organic material in the well in the bank structure, which as stated above, can give rise to non-uniformity in the displayed image and hence, a display of unacceptable image quality.

As mentioned above, a pattern of wells of bank material may be used to assist the alignment of the polymer materials. However, polymer material can only be deposited in each well once and the wells ultimately form the active pixels of the display device. Hence, if misalignment does occur to an unacceptable level it is not possible to reposition the ejection nozzle above any particular well of the bank structure and deposit a further droplet of the polymer material. Therefore, if any droplet of deposited polymer material is not in alignment with its respective well, a defective well of polymer material will already have been created on the substrate in the region which ultimately is to provide part of the active area of the final display device, degrading resolution and therefore displayed image quality.

There are also significant difficulties associated with the viewing of the polymer material in the wells of the bank structure, as will become clear from the description below. These difficulties become more severe when the polymer material has dried. Therefore, there is a significant need to be able to monitor the deposition of the organic polymer material in the fabrication of electroluminescent display devices and, in particular, to monitor droplet deposition at, or very shortly after deposition actually occurs. This can be referred to as in-situ viewing.

According to a first aspect of the invention, there is provided a method of selectively depositing a soluble material in the form of a series of droplets onto a first surface of a substrate using an ink jet print head, the method comprising detecting the droplets on the first surface through a further surface of the substrate opposite to the first surface.

Preferably, the droplets are detected prior to the deposited material changing from a wet condition to a dry condition.

In a preferred aspect of the invention the droplets are viewed as they deposit onto the first surface of the substrate.

Advantageously, the first surface of the substrate is provided with a pre-patterned structure for receiving deposited droplets.

In a most preferred aspect of the invention, the further surface of the substrate is irradiated with light of a wavelength to which the substrate is substantially transparent when viewing the deposition of the droplets onto the first surface.

The deposition of the droplets is preferably detected with a charge coupled device.

In a second aspect of the present invention, there is provided a method of making a display device including the fabrication of light emitting elements in accordance with the first aspect of the invention.

In a third aspect of the present invention, there is provided a display device comprising light emitting elements fabricated in accordance with the method of the first aspect of the present invention.

In accordance with a fourth aspect of the present invention, there is provided inkjet apparatus comprising an inkjet head for selectively depositing a series of droplets of a soluble material onto a first surface of a substrate, support means for supporting the substrate and arranged to move relative to the inkjet head, and detection means for detecting droplets on the first surface of the substrate through a further surface of the substrate opposite to the first surface.

BRIEF DESCRIPTION OF THE DRAWINGS

The present invention will now be described, by way of further example only and with reference to the accompanying drawings in which.

DETAILED DESCRIPTION OF EMBODIMENTS

Figure 1:
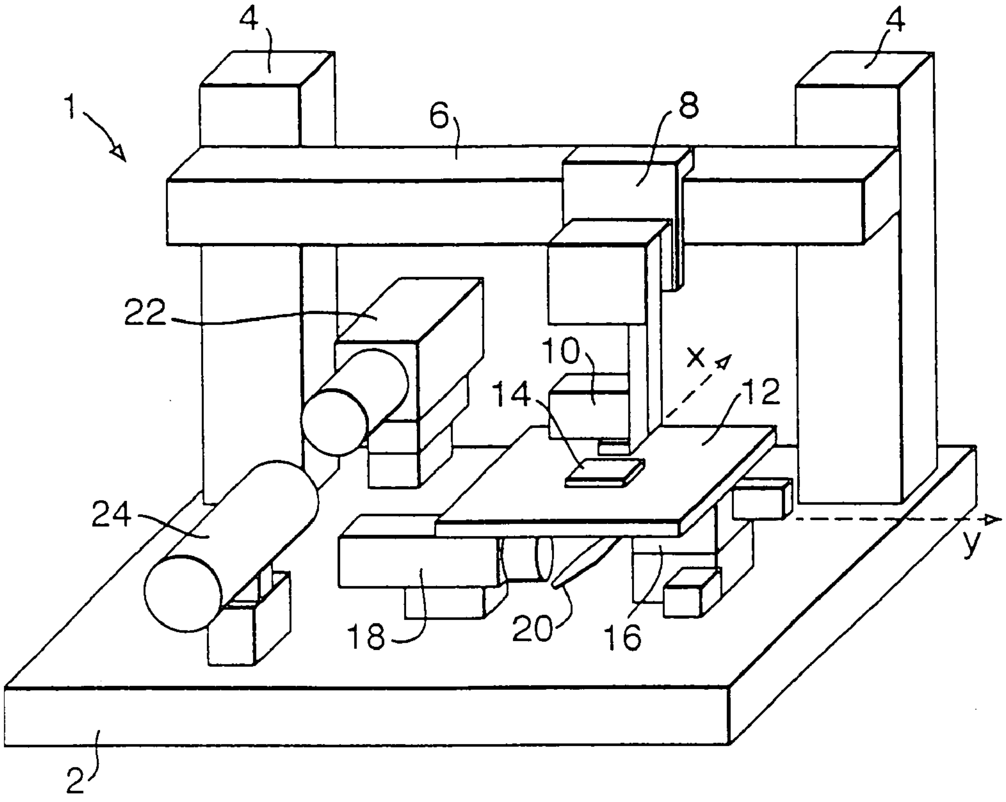
FIG. 1 is a schematic representation of an inkjet deposition machine in which deposition of a soluble material onto a substrate may be directly observed.
Figure 2:
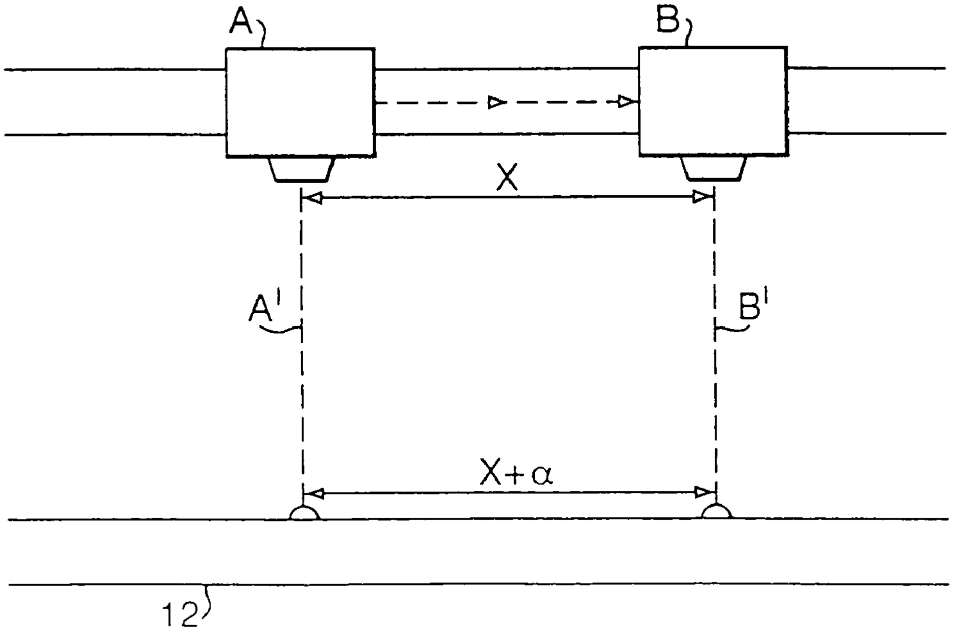
FIG. 2 shows the variable offset which can be produced by bending of the inkjet head translation system of the machine shown in FIG. 1.

Referring to FIG. 1, an inkjet deposition machine 1 comprises a base 2 supporting a pair of upright columns 4. The columns 4 support a transverse beam 6 upon which is mounted a carrier 8 supporting an inkjet print head 10. The base 2 also supports a platen 12 upon which may be mounted a substrate 14. The platen 12 is mounted from the base 2 via a computer controlled motorized support 16 for effecting movement of the platen 12 both in a transverse and a longitudinal direction relative to the inkjet print head, as shown by the axes X and Y in FIG. 1.

In accordance with the present invention, the base 2 also supports a charge coupled device (CCD) microscope 18 which is arranged below and slightly offset from the platen 12 for viewing the lower or under surface of the substrate 14 via a mirror 20. Equally, the CCD microscope could be arranged vertically under and arranged to move in unison with the platen 12, obviating the need for the mirror 20. Optionally, the inkjet deposition machine 1 also includes a second CCD microscope 22 and a stroboscope 24 mounted from the base 2. The carrier 8 is movable along the transverse beam 6 such that the inkjet print head 10 can be positioned in the space between the CCD microscope 22 and the stroboscope 24 so that the ejection of droplets from the inkjet print head 10 can be observed directly. This is to enable the driving condition of the inkjet print head 10 to be tuned for various solutions and polymers, which may be required to be ejected on to the substrate 14. As the movement of the platen 12, and hence the substrate 14 relative to the inkjet print head 10 is under computer control, arbitrary patterns may be printed onto the substrate by ejecting appropriate materials from the inkjet print head 10.

Figure 3:
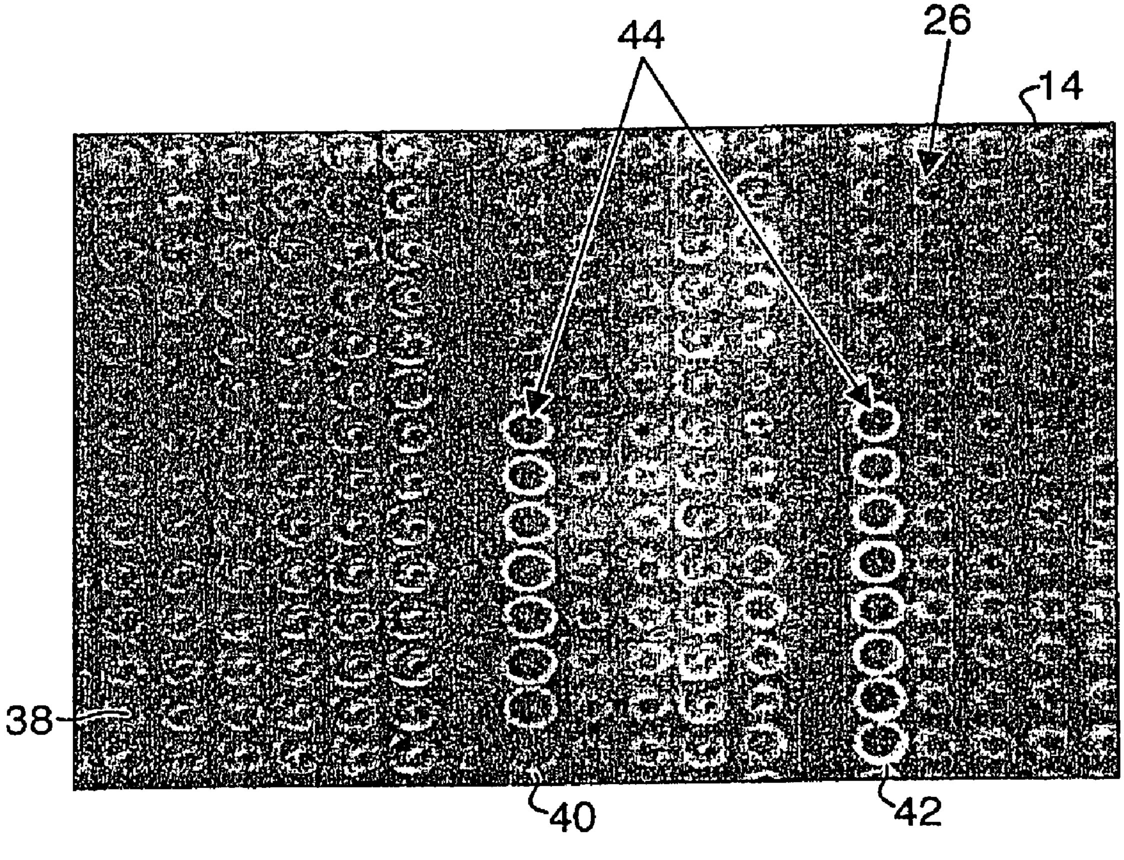
FIG. 3 shows a plan view of part of a substrate having a bank pattern of wells and illustrating examples of dry and recently deposited droplets of polymer material.

FIG. 3 shows an enlarged view of part of the substrate 14. It can be seen from FIG. 3 that the substrate 14 carries a pre-pattern in the form of an array of wells 26 of bank material which receive the organic polymer material ejected from the inkjet print head 10. The use of bank patterns is well known in this art and will not, therefore, be described further in the context of the present invention. As will be appreciated, to achieve the required resolution in a display device, the photoluminescent organic polymers, which form the light emitting diodes at each pixel must be very accurately deposited on the substrate 14. This is particularly so for a colour display, because individual spots of polymer material emitting red green or blue light must be provided at each pixel of the display to provide a colour image. Typically, in such a display device the organic polymer is a conjugated polymer and may comprise, for example, F8/F8BT/TFB where F8 is [poly9,9-dioctylfluorene)-], F8BT is [poly9,9-dioctylfluorine-co-2,1,3-benzolthiadizole)], and TFB is [polyl9,9-dioctylfluorine-co-N-(4-butylphenyl)diphenylamine)].

Figure 4:
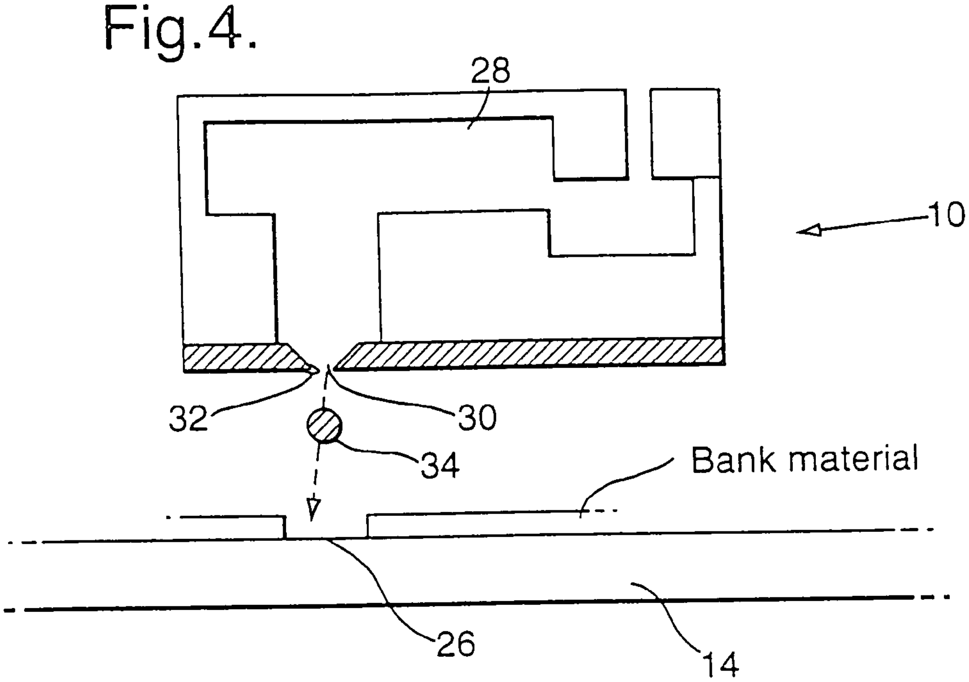
FIG. 4 illustrates schematically an inkjet print head showing the deviation in the flight path of an ejected droplet.

The bank material defining the wells 26 has a de-wetting surface, whereas the wells 26 themselves have wetting surfaces. Relatively good confinement and alignment of the polymer materials can thus be achieved, as can be seen from FIG. 3. However, referring to FIG. 4, the inkjet print head 10 typically comprises a reservoir 28 for accommodating the polymer material to be ejected through a nozzle 30, which, typically, has an ejection orifice of approximately 30 microns diameter. As stated above, for the fabrication of an electroluminescent display device the material to be ejected is an organic polymer dissolved in a suitable solvent, such as Toluene or Xylene. Such solvents are relatively volatile and it will be appreciated that the volume of the ejected droplets is very small, typically in the order of a few picolitres. As the polymer mix is ejected, a bubble of the polymer in solution forms initially at the nozzle 30 due to the surface tension of the solution. As the pressure within the inkjet head increases, the surface tension is overcome and a droplet of the polymer in solution is separated from the nozzle and ejected from the inkjet head. Partial evaporation of the solvent occurs whilst the bubble of solution is in contact with the nozzle causing some of the ejected polymer material to form a deposit 32 at the exit orifice of the nozzle 30. The deposit 32 forms in an irregular fashion and can cause an ejected droplet 34 to follow a non-vertical path, shown by the arrow in FIG. 4, onto the substrate, creating an offset between the actual and the required deposition site, i.e. the well 26. Some clogging of the nozzle 30 is a common occurrence in inkjet heads and to minimize the affect of the non-vertical flight path of the ejected droplets 34, the inkjet print head 10 is maintained as close as possible to the substrate 14 during the deposition cycle. However, a finite separation between the print head and substrate must necessarily be maintained, which gives rise to a deviation or offset between the actual and target deposition sites. Furthermore, in the fabrication of large area displays, flexible plastics sheets or flexible plastics in spoolable roll form can be particularly advantageous. Such flexible plastics substrates may be positioned over a rigid planar surface or may be tensioned in order to present a flat substrate for deposition under the print head. In either case distortion of the substrate has been found to occur and this distortion can vary as the substrate is being moved under the print head. Additionally, such substrates change in physical size with variations in ambient conditions, such as temperature and humidity. All of these factors can also give rise to a deviation or offset between the actual and target deposition sites of the droplets.

It can be seen, therefore, that there is a significant need to monitor the deposition of the droplets of organic polymer material onto the substrate. To date, the accuracy to which droplets have been deposited has been checked by checking the droplets after deposition using a suitable microscope. The deposited droplets are checked periodically from the deposition side of the substrate. However, the inkjet head typically consists of an array of ejection nozzles. Because of the physical size of the ink jet head and the objective lens of the viewing microscope, there is necessarily some separation distance between the current droplets being deposited and the droplets being viewed. There is also a considerable time delay between actual droplet deposition and viewing. The droplets are of very small volume and contain a high proportion of volatile solvent. Therefore they dry relatively quickly once deposited. Hence, the deposited droplets have attained a dry condition by the time they can be viewed and are very difficult to distinguish, especially when the deposited materials are transparent.

There is an added concern in viewing dry droplets using the currently known technique of viewing from the deposition side of the substrate in that the droplets can move as they dry. A droplet consists typically of 1% to 5% by volume of organic polymer material, the remaining 95% to 99% being solvent. It can be appreciated therefore that once a droplet has dried the actual material remaining on the substrate is of far smaller volume than the volume of the droplet actually deposited onto the substrate. The material remaining also occupies a much smaller area than the droplet as deposited. If the surface of the substrate is uniform then the material which remains as a dry droplet of organic polymer is usually positioned at the centre of the area occupied by a droplet as deposited. However, if the surface of the substrate includes non-uniformities, which is frequently the case, and particularly for plastics substrates, the polymer material in the deposited droplet can be attracted by such a surface non-uniformity during the drying process. The dried material remaining on the substrate can therefore be disposed to one side or an extremity of the area occupied on the substrate by a droplet as deposited, or it may remain substantially at the centre, depending upon the position of the non-uniformity. Hence, viewing of a dried droplet is not a true indication of deposition alignment because, for a particular deposited droplet, the organic polymer material may have "moved" into exact alignment with a target deposition site during the drying process because of the presence of a non-uniformity on the surface of the substrate at the actual site where the droplet was deposited.

It can also occur that this movement of a droplet when drying can give rise to no overlap between the target well in the bank structure and a partially dry deposited droplet, in which case the contrast in the wettability between the droplet and the material of the bank structure is negated, making it more difficult for the droplet to align in the well of the bank structure.

It has also been proposed to view deposited droplets by temporarily moving the inkjet head from the area being deposited and then positioning a suitable microscope over the last deposited droplets. However, this proposal has proved problematical because the droplets dry before the microscope can be moved to the viewing position and, as the display size increases, it becomes particularly difficult to determine the position of the last deposited droplets on the substrate. A principal reason for this is that many of the polymer materials used, when dry, cannot be distinguished easily from the background substrate material.

Furthermore, to repeatedly move the inkjet head away and back to the deposition location is not efficient and there is no real time monitoring of deposition so feedback on the viewing cannot be maximized.

It will be realized from the above description that the droplets of polymer material are deposited in a wet state or condition but, in view of their relatively small size and the fact that they comprise polymer material dissolved in a relatively volatile solvent, harden or dry relatively quickly to a dry condition. It has been determined with the present invention that the deposited droplets are far easier to view and distinguish from the opposite or non-deposition side of the substrate. Thus, it has been determined that the deposited droplets can be viewed with suitable apparatus, such as a microscope, when in the wet condition, that is between deposition and attaining their dry condition, and hence can be viewed before they reach a condition where they are extremely difficult to see; namely prior to the dry condition being attained, and that this characteristic of the deposited droplets of the polymer material, before drying, can be exploited to significant advantage in order to check the accuracy of deposition of the polymer material.

As stated above, the polymer material droplets change very quickly to the dry condition after deposition and it has been appreciated, therefore, that to exploit this characteristic of the polymer material droplets in the wet condition, there is a strong need for in-situ viewing of deposited droplets of material.

The problems associated with viewing deposited polymer material can be more readily appreciated with reference to FIG. 3. If the polymer material has reached its dry condition shown as droplets 38 in FIG. 3 it is difficult to distinguish on the substrate.

However, as can also be seen from FIG. 3, the more recently deposited droplets i.e. those droplets which have not yet attained a dry condition from the wet condition in which they were deposited, are relatively easy to distinguish. It can be seen also from this figure that, of the two rows 40, 42 of more recently deposited droplets, the last or most recently deposited droplets 44 are the most visible, the visibility decreasing with an increase of the time since deposition.

It is known that objects can be viewed as 'bright field' or 'dark field' images through the use of appropriate imaging systems.

Figure 5:
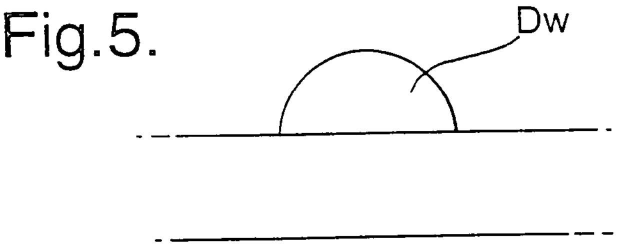
FIG. 5 shows a droplet of polymer material in a wet condition on a substrate.
Figure 6:
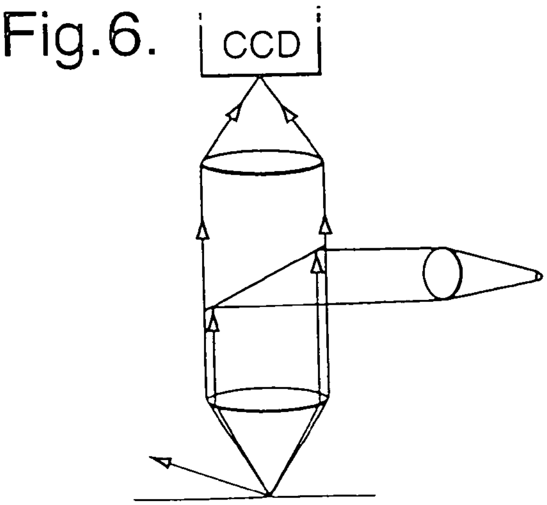
FIG. 6 shows schematically a bright field imaging system.
Figure 7:
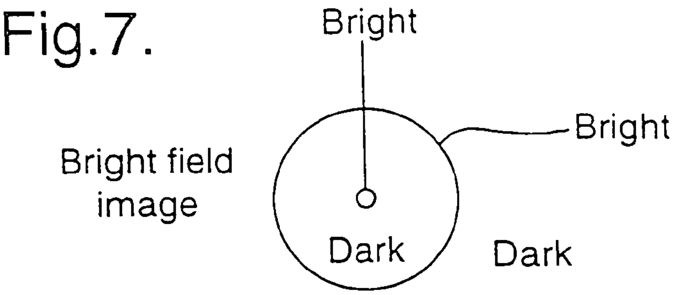
FIG. 7 shows the droplet of FIG. 5 when viewed as a bright field image.

FIG. 5 shows a droplet Dw of polymer material on a substrate in a wet condition. If the wet droplet $D_W$ is viewed by a bright field image optical arrangement as shown in FIG. 6 from the underside of the substrate, light rays from the imaging light source enter the droplet. Those light rays which are not coincident with the centre axis of the droplet undergo internal reflection. However, in the region of the centre axis of the droplet, the upper surface of the droplet is substantially parallel to the substrate. Hence, those light rays passing in the vicinity of the centre axis of the droplet are able to exit the droplet. When the droplet is viewed, therefore, it appears as a very bright spot against a dark circular ground area, surrounded by the bright field background, as shown in FIG. 7. The bright spot at the centre of the image is substantially co-incident with the centre axis of the droplet. This bright field image can therefore be used to advantageous effect to determine the accuracy to which the droplet has been deposited.

Figure 8:
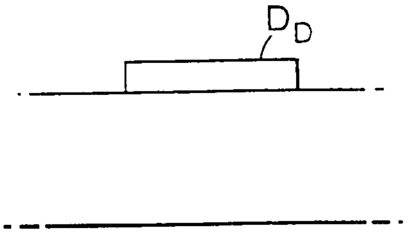
FIG. 8 shows a droplet of polymer material in a dry condition on a substrate.
Figure 9:
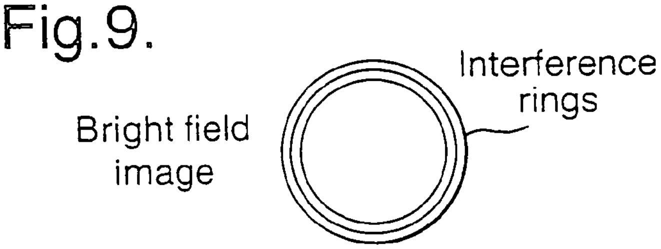
FIG. 9 shows the droplet of FIG. 8 when viewed as a bright field image.

FIG. 8 shows the droplet once it has attained a dry condition, indicated as $D_D$. It can be seen that the hemispherical wet droplet $D_W$ has assumed the shape of a relatively flat thin disc. If a glass substrate is used, the dry droplet has a refractive index which is substantially the same as the substrate material. In this case slight scattering of the light rays occurs which gives rise only to a slight image contrast at the edges of the droplet, which makes the dry droplet relatively difficult to detect. However, if the respective refractive indices of the understructure and the deposited material are different, and if the bright field imaging system shown in FIG. 7 is used to view the dried droplet $D_D$, the light rays pass into the droplet but undergo reflection at the far side of the droplet. The reflected light rays interfere with each other and create interference rings of various colours, the colours being dependent on the thickness of the droplet. This image is shown schematically in FIG. 9. The image shows as coloured interference rings which tend to merge with each other in the viewed image. It is relatively difficult, therefore, to discern a sharp outline for the viewed image. It is readily apparent from a comparison between the wet droplet bright field image shown in FIG. 7 and the dry droplet bright field image shown in FIG. 9, that it is significantly easier to check alignment of the deposited droplet using the image of FIG. 7 than to use the image of FIG. 9.

Figure 10:
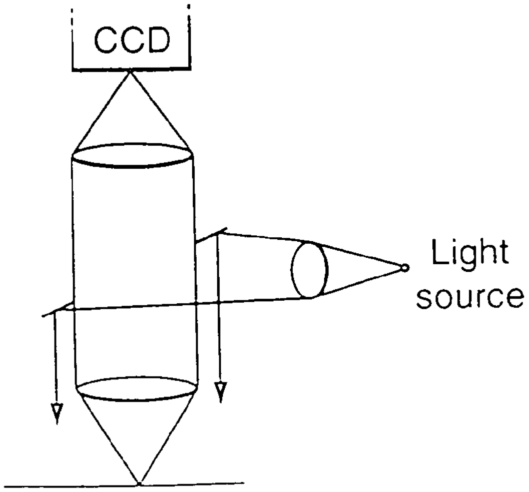
FIG. 10 shows schematically a dark field imaging system.
Figure 11:
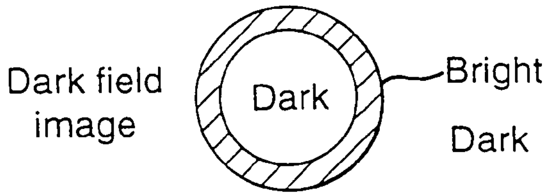
FIG. 11 shows the droplet of FIG. 5 when viewed as a dark field image.
Figure 12:
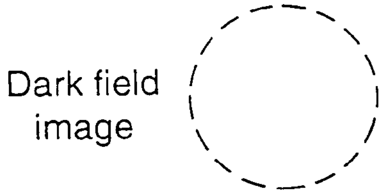
FIG. 12 shows the droplet of FIG. 8 when viewed as a dark field image.
Figure 13:
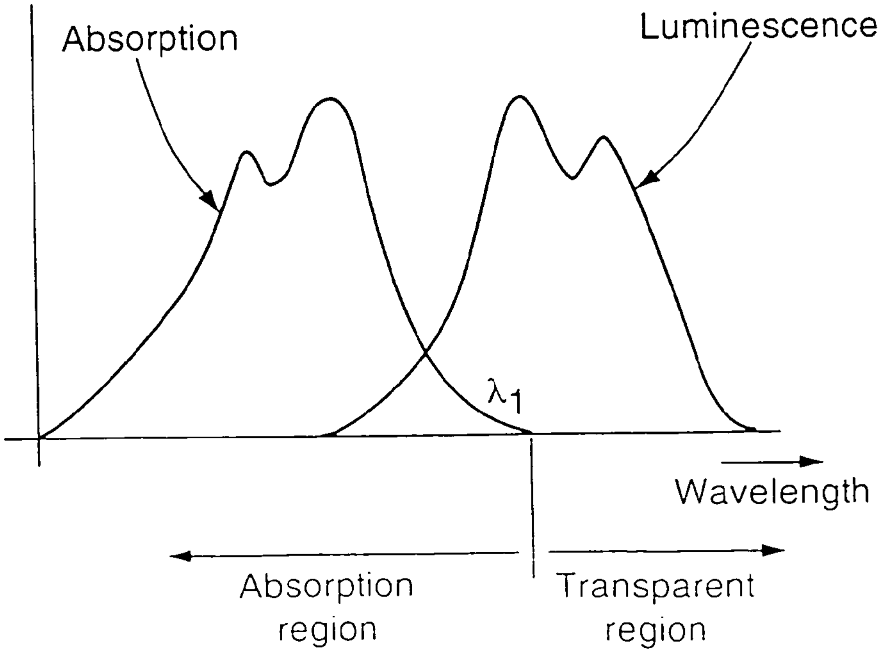
FIG. 13 shows absorption and luminescence characteristics for a conjugated polymer material.

FIG. 10 shows a dark field imaging system, and if the wet droplet $D_W$ shown in FIG. 5 is viewed with this system, light from the light source enters the droplet and undergoes reflection within the wet droplet of material. Some scattering of the light occurs at the edges of the droplet and hence, the wet droplet appears as a bright but well defined annular ring with a dark centre against a dark background. As the bright ring is well defined, the image shown in FIG. 11 is far more beneficial to use to check alignment of the deposited droplet than the bright field image of the dry droplet shown in FIG. 9.

If the dry droplet $D_D$ shown in FIG. 8 is viewed with the dark field imaging system shown in FIG. 10, most of the light impinging on the droplet is scattered and passes outside the field of view of the imaging lens. The dried droplet $D_D$ appears therefore as a very feint circular image against a dark background and this image is very difficult to detect and cannot be used to check droplet alignment.

From the above bright and dark field images for the dry and wet droplets, it can be appreciated that significant and unexpected benefits can be realized if the deposited droplets are viewed in-situ whilst they are still in a wet condition. In-situ viewing can be carried out using the apparatus shown in FIG. 1. However, the organic polymer materials are deposited on the upper surface of the substrate, when viewed in FIG. 1 and, hence, for in-situ viewing it is necessary to view deposition of the polymer materials through the substrate. Viewing of the droplets can be made easier if the substrate is illuminated with light. As the materials are viewed through the substrate a first consideration therefore is that the substrate is transparent at the wavelength of the light used for viewing. When the substrate is of glass or transparent plastic, visible light or longer wavelength radiation can be used. When the substrate is made of silicon, infra-red light, whose wavelength is longer than 1.1 microns can be used.

There is also a second consideration for in-situ viewing of conjugated polymers printed by an inkjet technique. The characteristics for absorption and emission (luminescence) of light of a conjugated polymer are shown in FIG. 11. It can be seen from FIG. 11 that there is an overlap region for the absorption and luminescence characteristics. The conjugated polymer will absorb, to varying degrees, light incident upon the polymer having a wavelength less than $\lambda_1$. This is indicated as the absorption region in FIG. 11. The conjugated polymer is only transparent to incident light having a wavelength greater than $\lambda_1$ and this is indicated as the transparent region in FIG. 11.

Figure 14:
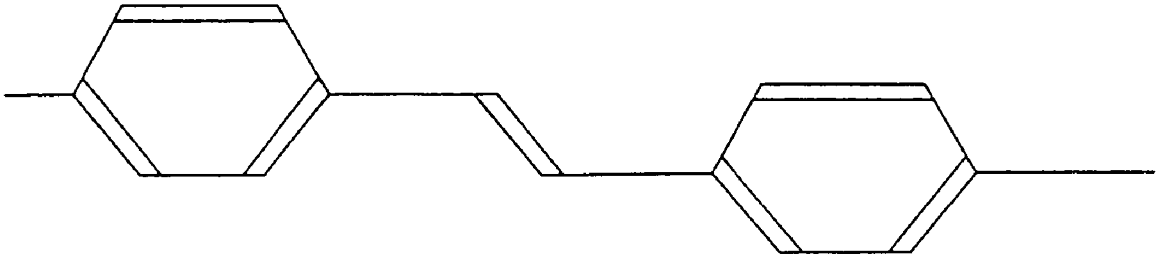
FIG. 14 shows part of the polymer chain for a conjugated polymer material.
Figure 15:
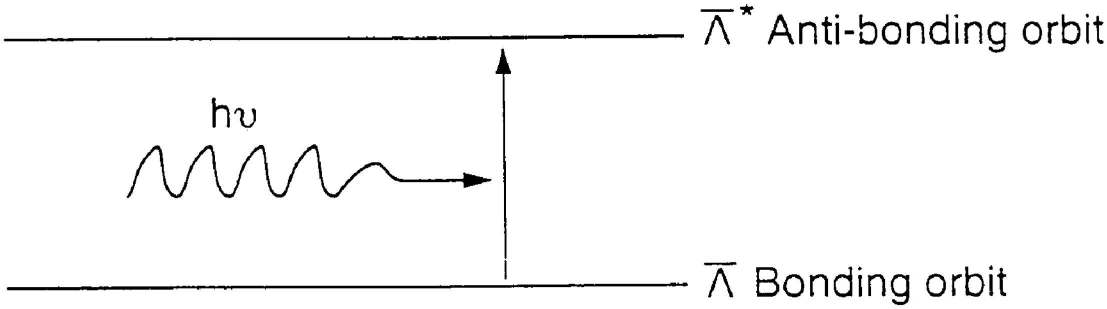
FIG. 15 shows schematically the excitation of electrons of a conjugated polymer under incident radiation.
Figure 16:
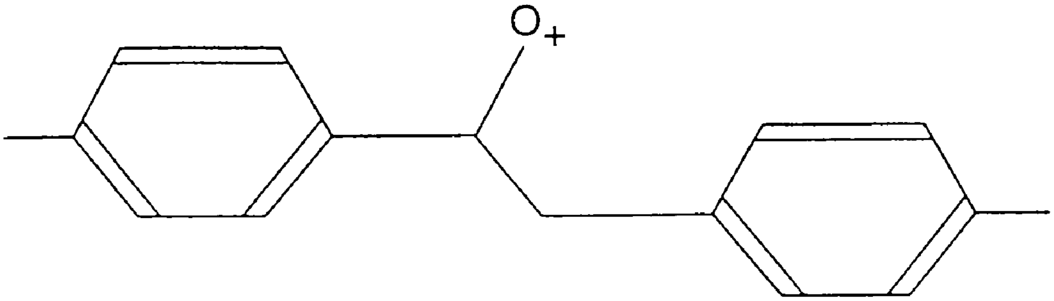
FIG. 16 shows oxidation of the polymer chain illustrated in FIG. 14.

A conjugated polymer chain is shown in FIG. 14 and delocalised π bonding orbit electrons exist along the chain. These electrons have a relatively narrow band gap compared to sigma bonding electrons which also exist in the polymer chain. If the conjugated polymer absorbs Ultra Violet (UV) or visible light, the π bonding electrons are excited from the π bonding orbit (grand state) to a π* anti-bonding orbit (excited state), as shown schematically in FIG. 15. The excited state is less stable than the grand state with respect to the π bonding between atoms. If oxygen atoms are present and this excitation occurs, the π bonding is destroyed and some bonding takes place between the oxygen atoms in the ambient atmosphere and the carbon atoms of the conjugated polymer, giving rise to the photo oxidized polymer chain shown in FIG. 16. This bonding can occur when there are oxygen atoms in the ambient atmosphere of the conjugated polymer and the light to which the conjugated polymer is exposed has a component in the absorption region for the conjugated polymer, i.e. a component having a wavelength less than $\lambda_1$ shown in FIG. 11.

The bonding between the oxygen and carbon atoms degrades the conjugated polymers which gives rise to lower luminance efficiency in LED's and lower charge mobility for organic thin film transistors (TFT's). One option to obviate this polymer degradation is to print the conjugated polymers in an atmosphere which does not contain oxygen. This entails locating the apparatus shown in FIG. 1 in a chamber where the ambient atmosphere within the chamber can be carefully controlled to ensure no oxygen is present. However, this increases process complexity and, furthermore, increases fabrication costs. It is therefore a more realistic proposition to control the wavelength of the light used for in-situ viewing so as to be in the transparent region of the conjugated polymer, i.e. a wavelength greater than $\lambda_1$ shown in FIG. 11.

When a multi-colour display is manufactured, the red light emitting polymer has the narrowest band gap (longest wavelength for the absorption edge $\lambda_1$). In this case, the light used in the imaging system for in-situ viewing of droplet deposition should not involve a spectral component having a wavelength shorter than the wavelength of the absorption edge for the red light emitting polymer. Furthermore, the silicon detector of the CCD used for detection decreases in sensitivity with an increase in the wavelength of the light used and becomes transparent when the incident light has a wavelength of about 1.1 μm. A wavelength of about 900 nm has been found to continue to provide acceptable sensitivity for the CCD. Hence, for a multi-colour display, deep red or infra-red light having a wavelength in the range of about 600 nm to about 900 nm should be used to avoid photo oxidation and therefore degradation of the red light emitting polymer, whilst enabling the efficient use of a CCD for detection.

Figure 17:
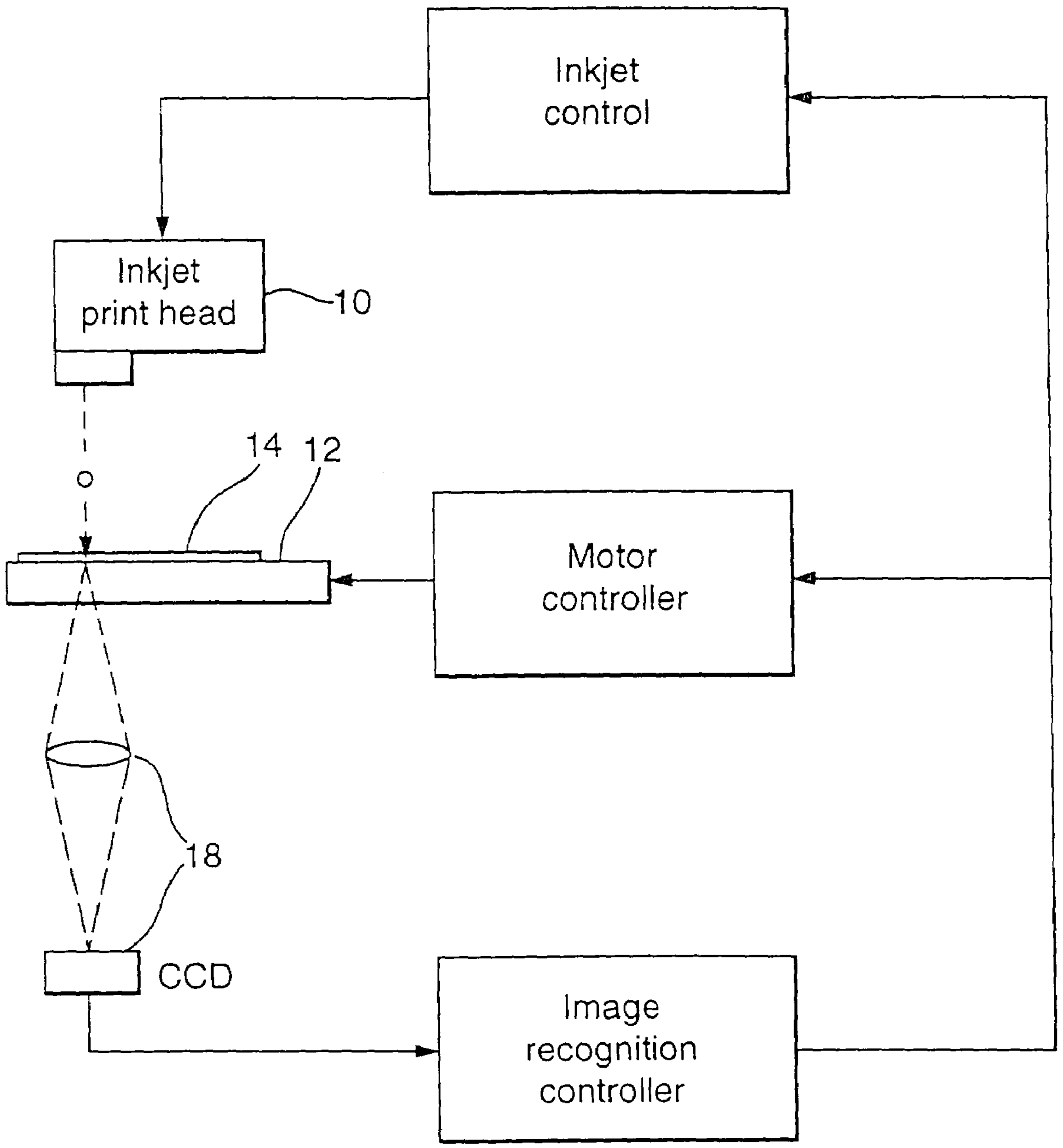
FIG. 17 is a schematic representation of a system for implementing offset control or inkjet cleaning in the machine shown in FIG. 1.

With the present invention, as there may be in-situ viewing of the deposited droplet before the dry condition is attained, any offset between the deposited droplet and a well in the bank structure can be seen more easily. Furthermore, as the potential offset in the deposited material can be monitored continuously or periodically throughout the duration of the deposition cycle, any increase in offset to beyond a tolerable limit may be quickly detected and appropriate positional compensation between the platen and the inkjet head may be provided by the computer controlled motorized support 16. If cleaning of the nozzles of the inkjet head is considered appropriate, then the deposition machine may as an alternative or as an addition to offset control, implement a cleaning cycle for the inkjet head. Such a system is shown in FIG. 17.

By way of example, the invention has been described with reference to the fabrication of electroluminescent displays where the fabrication of active pixel elements with unacceptable offset can therefore be considerably reduced. However, the present invention may also be used in the fabrication of conjugate polymer TFT's , interconnects for LED's or TFT's, solar cells incorporating conjugate polymers, inkjet etching or any other application where accurate alignment of the inkjet head with deposition sites on a substrate is of primary importance.

Figure 18:
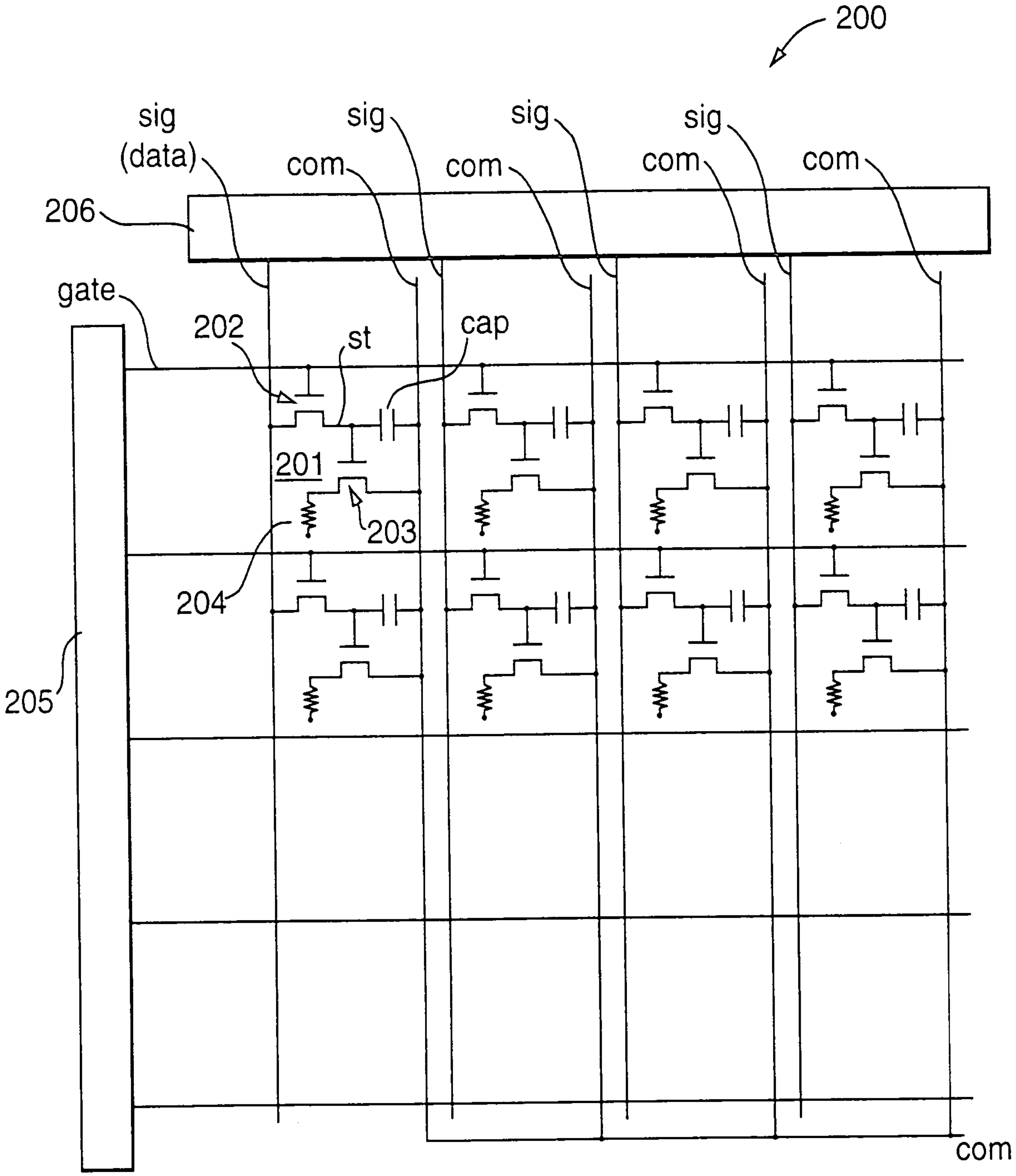
FIG. 18 shows a block diagram of an electro-optic device.

FIG. 18 is a block diagram illustrating an active matrix type display device (or apparatus) incorporating electro-optical elements, such as organic electroluminescent elements as a preferred example of the electro-optical devices, and an addressing scheme which may be fabricated using the method or apparatus of the present invention. In the display device 200 shown in this figure, a plurality of scanning lines "gate", a plurality of data lines "sig" extending in a direction that intersects the direction in which the scanning lines "gate" extend, a plurality of common power supply lines "com" extending substantially parallel to the data lines "sig", and a plurality of pixels 201 located at the intersections of the data lines "sig" and the scanning lines "gate" which are formed above a substrate.

Each pixel 201 comprises a first TFT 202, to which a scanning signal is supplied to the gate electrode through the scanning gate, a holding capacitor "cap" which holds an image signal supplied from the data line "sig" via the first TFT 202, a second TFT 203 in which the image signal held by the holding capacitor "cap" is supplied to the gate electrode (a second gate electrode), and an electro-optical element 204 such as an electroluminescent element (indicated as a resistance) into which the driving current flows from the common power supply line "corn" when the element 204 is electrically connected to the common power supply line "corn" through the second TFT 203. The scanning lines "gate" are connected to a first driver circuit 205 and the data lines "sig" are connected to a second driver circuit 206. At least one of the first driver circuit 205 and the second driver circuit 206 can be preferably formed above the substrate above which the first TFTs 202 and the second TFTs 203 are formed. The TFT array(s) manufactured by the methods according to the present invention can be preferably applied to at least one of an array of the first TFTs 202 and the second TFTs 203, the first driver circuit 205, and the second driver circuit 206.

The present invention may therefore be used to fabricate displays and other devices which are to be incorporated in many types of equipment such as mobile displays e.g. mobile phones, laptop personal computers, DVD players, cameras, field equipment; portable displays such as desktop computers, CCTV or photo albums; instrument panels such as vehicle or aircraft instrument panels; or industrial displays such as control room equipment displays. In other words, an electro-optical device or display to which the TFT array(s) manufactured by the methods according to the present invention is (are) applied as noted above can be incorporated in the many types of equipment, as exemplified above.

Various electronic apparatuses using electro-optical display devices fabricated in accordance with the present invention will now be described.

<1: Mobile Computer>

An example in which the display device fabricated in accordance with one of the above embodiments is applied to a mobile personal computer will now be described.

Figure 19:
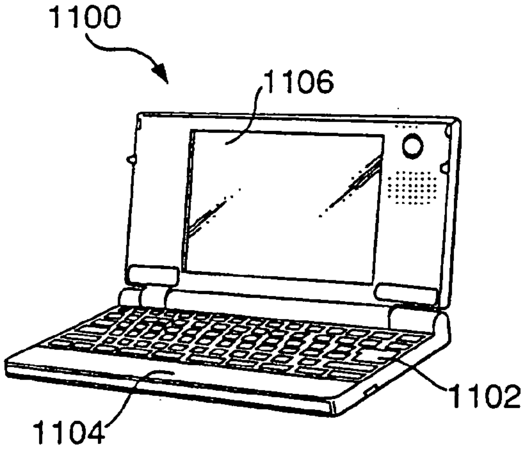
FIG. 19 is a schematic view of a mobile personal computer incorporating a display device fabricated in accordance with the present invention.

FIG. 19 is an isometric view illustrating the configuration of this personal computer. In the drawing, the personal computer 1100 is provided with a body 1104 including a keyboard 1102 and a display unit 1106. The display unit 1106 is implemented using a display panel fabricated according to the patterning method of the present invention, as described above.

<2: Portable Phone>

Figure 20:
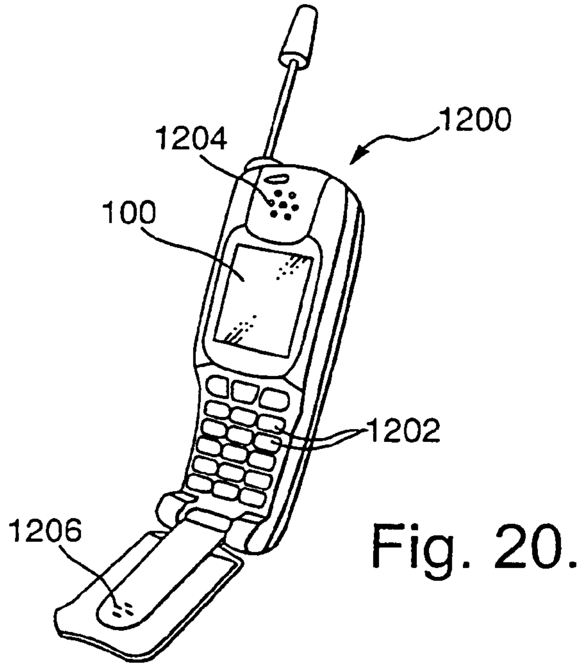
FIG. 20 is a schematic view of a mobile telephone incorporating a display device fabricated in accordance with the present invention.

Next, an example in which the display device is applied to a display section of a portable phone will be described. FIG. 20 is an isometric view illustrating the configuration of the portable phone. In the drawing, the portable phone 1200 is provided with a plurality of operation keys 1202, an earpiece 1204, a mouthpiece 1206, and a display panel 100. This display panel 100 is implemented using a display device fabricated in accordance with the method of the present invention, as described above.

<3: Digital Still Camera>

Figure 21:
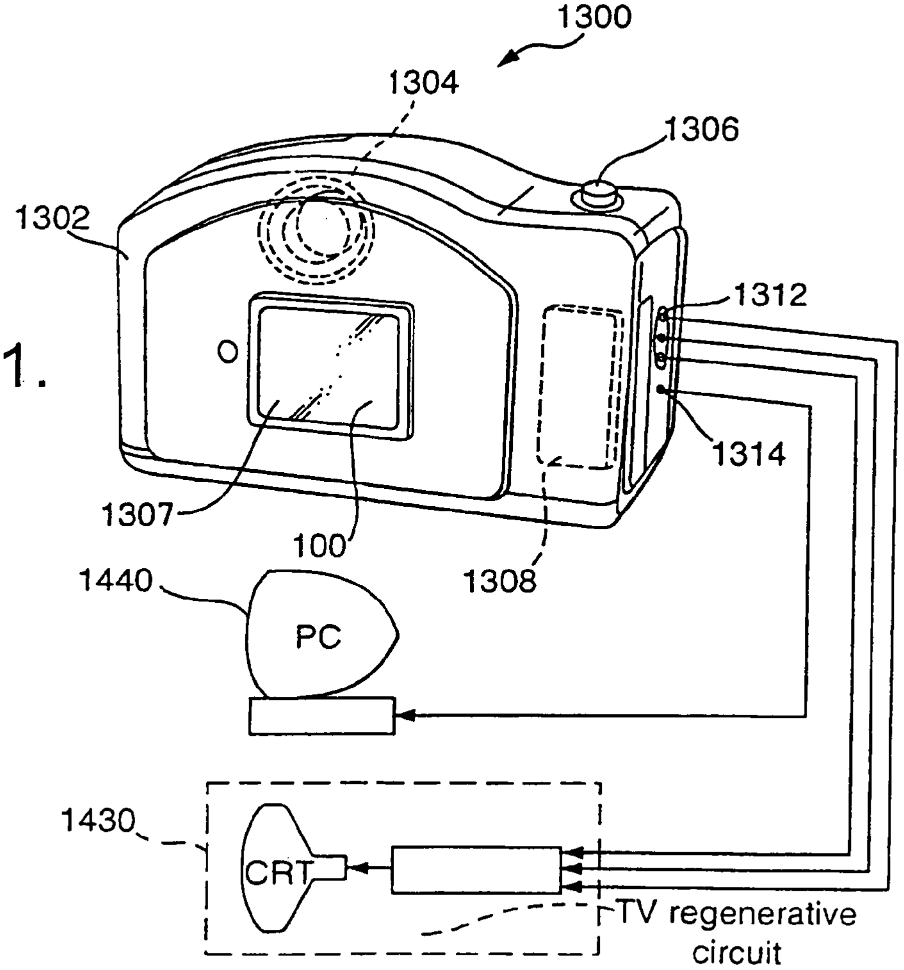
FIG. 21 is a schematic view of a digital camera incorporating a display device fabricated in accordance with the present invention.

Next, a digital still camera using an OEL display device as a finder will be described. FIG. 21 is an isometric view illustrating the configuration of the digital still camera and the connection to external devices in brief.

Typical cameras use sensitized films having light sensitive coatings and record optical images of objects by causing a chemical change in the light sensitive coatings, whereas the digital still camera 1300 generates imaging signals from the optical image of an object by photoelectric conversion using, for example, a charge coupled device (CCD). The digital still camera 1300 is provided with an OEL element panel 1307 at the back face of a case 1302 to perform display based on the imaging signals from the CCD. Thus, the display panel 100 functions as a finder for displaying the object. A photo acceptance unit 1304 including optical lenses and the CCD is provided at the front side (behind in the drawing) of the case 1302.

When a cameraman determines the object image displayed in the OEL element panel 1307 and releases the shutter, the image signals from the CCD are transmitted and stored to memories in a circuit board 1308. In the digital still camera 1300, video signal output terminals 1312 and input/output terminals 1314 for data communication are provided on a side of the case 1302. As shown in the drawing, a television monitor 1430 and a personal computer 1440 are connected to the video signal terminals 1312 and the input/output terminals 1314, respectively, if necessary. The imaging signals stored in the memories of the circuit board 1308 are output to the television monitor 1430 and the personal computer 1440, by a given operation.

Examples of electronic apparatuses, other than the personal computer shown in FIG. 19, the portable phone shown in FIG. 20, and the digital still camera shown in FIG. 21, include OEL element television sets, view-finder-type and monitoring-type video tape recorders, vehicle navigation and instrumentation systems, pagers, electronic notebooks, portable calculators, word processors, workstations, TV telephones, point-of-sales system (POS) terminals, and devices provided with touch panels. Of course, OEL devices fabricated using the method of the present invention can be applied not only to display sections of these electronic apparatuses but also to any other form of apparatus which incorporates a display section.

Furthermore, the display devices fabricated in accordance with the present invention are also suitable for a screen-type large area television which is very thin, flexible and light in weight. It is possible therefore to paste or hang such large area television on a wall. The flexible television can, if required, be conveniently rolled up when it is not used.

Printed circuit boards may also be fabricated using the technique of the present invention. Conventional printed circuit boards are fabricated by photolithographic and etching techniques, which increase the manufacturing cost, even though they are a more cost-oriented device than other microelectronics devices, such as IC chips or passive devices. High-resolution patterning is also required to achieve high-density packaging. High-resolution interconnections on a board can be easily and reliably be achieved using the present invention.

Colour filters for colour display applications may also be provided using the present invention. Droplets of liquid containing dye or pigment are deposited accurately onto selected regions of a substrate. A matrix format is frequently used with the droplets in extremely close proximity to each other. In situ viewing can therefore prove to be extremely advantageous. After drying, the dye or pigments in the droplets act as filter layers.

DNA sensor array chips may also be provided using the present invention. Solutions containing different DNAs are deposited onto an array of receiving sites separated by small gaps as provided by the chips.

The aforegoing description has been given by way of example only and it will be appreciated by a person skilled in the art that modifications can be made without departing from the scope of the present invention.

What is claimed is:

1. A method of manufacturing a pattern, the method comprising:

depositing droplets including a material onto a first surface of a substrate using an inkjet head;

detecting a droplet deposited on the first surface; and controlling a relative position between the inkjet head and the substrate in dependence upon the detecting of the droplet before a solvent, included in the droplet deposited on the first surface, evaporates.

2. The method of claim 1, the detecting of the droplet being carried out by a detector that obtains a bright field image of the droplet deposited on the first surface by irradiating a second surface of the substrate opposite to the first surface with a light.

3. The method of claim 2, the droplet being detected as it deposits onto the first surface of the substrate.

4. The method of claim 2, further comprising:

providing the first surface of the substrate with a prepattemed structure for receiving a deposited droplet.

5. The method of claim 2, the detector being a charge coupled device.

6. The method of claim 2, the substrate being supported on a motorized platen arranged to move relative to the ink jet head.

7. The method of claim 6, further comprising: moving the motorized platen relative to the inkjet head.

8. The method of claim 6, the detector being arranged below the motorized platen.

9. The method of claim 2, the substrate being a rigid substrate of glass, silicon or plastics material.

10. The method of claim 2, the substrate being a flexible plastics material.

11. The method of claim 2, the material comprising a conjugated polymer.

12. The method of claim 2, further comprising:

implementing a cleaning cycle for the inkjet print head in dependence upon the detection of the droplets before the solvent included in the droplet deposited on the first surface evaporates.

13. The method of claim 2, the forming of the pattern being carried out by depositing the droplet onto a film, and the droplet etching the film.

14. A method of fabricating a color filter, the method comprising:

forming a pattern using the method of claim 2, the material being usable to form the color filter.

15. A method of manufacturing a display device comprising light emitting elements, the method comprising:

forming a pattern using the method of claim 2, the material being for forming the light emitting elements.

16. A method of manufacturing an electronic device, the method comprising:

forming a pattern using the method of claim 2, the material being for forming the electronic device.

17. The method of claim 2, the detector comprising a charge coupled device.

18. The method of claim 2, the detector comprising a light device to illuminate the substrate with light having a wavelength to which the substrate is transparent.

19. The method of claim 18, the material comprising a conjugated polymer and the light having a wavelength greater than the wavelength of an absorption edge of the conjugated polymer.

20. The method of claim 2, the detector being arranged below the substrate.

21. The method of claim 2, the detector detecting the droplet through a lens.

22. The method of claim 2, the detector obtaining an image of the droplet.

23. The inkjet apparatus according to method of claim 2, the detector being positioned to detect the droplets deposited on the substrate through the substrate.

24. The method of claim 2, the detector being configured to obtain an image of the droplets.

25. The method of claim 2, the substrate being transparent to the light.

26. The method of claim 2, the light being selected to have a wavelength that is greater than a wavelength of an absorption edge of the material.

27. The method of claim 26, the light having a wavelength in a range of about 600 nm to 900 nm.

28. A method of making a display device, comprising:

fabricating light emitting elements using the method of claim 1.

29. A method of fabricating a transistor, the method comprising:

forming a pattern using the method of claim 1, the material being for forming the transistor.

30. A method of manufacturing a pattern, the method comprising:

depositing droplets including a material onto a first surface of a substrate using an inkiet head;

detecting a droplet deposited on the first surface; and implementing a cleaning cycle for the inkjet head in dependence upon the detecting of the droplet deposited on the first surface, before a solvent included in the droplet deposited on the first surface evaporates.

31. The method of claim 30, further comprising:

controlling the relative position between the inkjet print head and the substrate in dependence upon detection of the droplet before the solvent included in the droplet deposited on the first surface evaporates.

* * * * *